Jan. 19, 1954 W. SHOCKLEY 2,666,818

TRANSISTOR AMPLIFIER

Filed Sept. 13, 1951

INVENTOR
W. SHOCKLEY
BY
ATTORNEY

Patented Jan. 19, 1954 2,666,818

UNITED STATES PATENT OFFICE 2,666,818

TRANSISTOR AMPLIFIER

William Shockley, Madison, N. J., assignor to Bell Telephone Laboratories, Incorporated, New York, N. Y., a corporation of New York Application September 13, 1951, Serial No. 246,428

8 Claims. (Cl. 179—171)

This invention relates to signal translating devices and more particularly to translating circuits including devices of the class now known as transistors.

One general object of this invention is to improve signal translating circuits including transistors. More specifically, objects of this invention are to simplify such circuits, reduce the number and magnitude of the bias sources requisite for transistor operation and enable performance of unique functions by transistors.

Transistors comprise, in general, a body of semiconductive material, such as germanium, having three connections thereto designated the emitter, base and collector. In one manner of operation, signals are impressed between the emitter and base and amplified replicas of these signals are obtained in a load connected between the collector and the emitter. In another manner of operation, the input is applied between the base and the collector and the output circuit is connected between the emitter and the collector. As is known, either current or voltage gains, or both, can be obtained.

Two general types of transistors are the point contact type and the junction type. In the former, of which those disclosed in Patent 2,524,035, granted October 3, 1950 to J. Bardeen and W. H. Brattain are illustrative, the emitter and collector may be point contacts bearing against the semiconductive body and the base is a substantially ohmic connection to the body. In the junction type, of which the devices disclosed in the application Serial No. 35,423, filed June 26, 1948 of W. Shockley, now Patent 2,569,347, granted September 25, 1951, in the Bell System Technical Journal, July 1949, pages 435 et seq. and in the application Serial No. 228,483, filed May 26, 1951 of W. Shockley are illustrative, the semiconductive body comprises a zone of one conductivity type between and contiguous with two zones of the opposite conductivity type, a base connection to the intermediate zone and emitter and collector connections to the outer zones respectively. The body in point contact devices and the intermediate zone in junction devices may be of either conductivity type. Herein, point contact devices wherein the semiconductive body is of N-type, and junction devices wherein the intermediate zone is of N-type will be referred to as N devices or transistors; point contact devices wherein the body is of P-type and junction devices wherein the intermediate zone is of P-type will be referred to as P devices or transistors.

In general, the operating characteristics of P and N transistors are of like form but unlike sign. The difference in sign results from the difference in the sign of the carriers, holes or electrons, of principal import in realizing transistor action. Specifically, in N-type devices, such action involves the injection of holes into the body or intermediate zone whereas in P-type devices electrons are injected into the body or intermediate zone. Considering positive current in the conventional sense, i. e. as in the direction opposite to the direction of electron flow, in an N-type transistor such current flows into the emitter and out of the collector whereas in a P-type transistor such current flows into the collector and out of the emitter. In N devices, a positive signal applied to the emitter tends to drive it toward saturation whereas a similar signal applied to the emitter of a P device tends to drive it toward its collector voltage cut-off.

In accordance with one broad feature of this invention, in a signal translating device, for example an amplifier, pairs of transistors of opposite types are employed and associated to produce advantageous performance characteristics.

In one illustrative and specific embodiment of this invention, a pair of transistors, one of P- and the other N-type, are connected in series across a biasing source, with the collectors of the two devices tied together, and a load connected across one of the devices. Signals to be translated are applied to the base of one or both the transistors. By virture of the direct connection of the collectors, each transistor in effect provides a high output impedance for the other and high voltage gain is realizable, and this through utilization of but a relatively low voltage biasing source.

In another illustrative and specific embodiment of this invention, a P and an N transistor are serially connected across a biasing source with the emitters of the two devices tied together directly and the load connected across the emitter and collector of one device. Signals are applied to both bases. By virtue of the different sign of the operating characteristics, output currents are obtained for input signals of both polarities. In effect, a two-sided cathode follower action is realized.

Advantageously, the transistors employed in circuits according to this invention have a current multiplication factor $\alpha$ of substantially unity so that but very small changes in base currents are required to produce large changes in the other currents.

The invention and the several features thereof will be understood more clearly and fully from the following detailed description with reference to the accompanying drawing in which.

Figure 1:
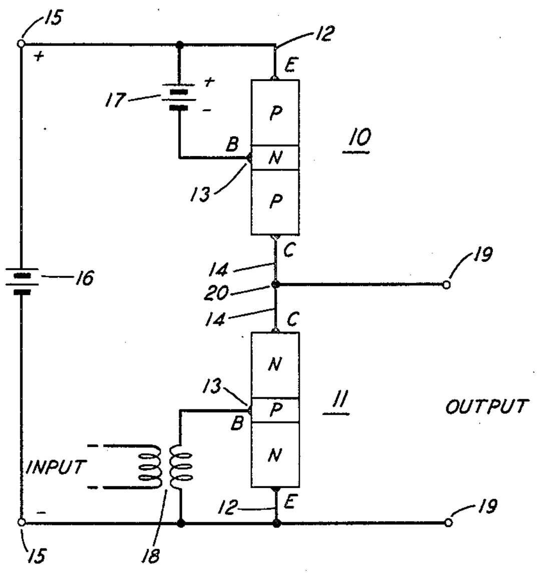
Fig. 1 is a circuit diagram of an amplifier illustrative of one embodiment of this invention wherein the collectors of the two transistors are tied together and input signals are applied to the base of one device.

In the several figures of the drawing, for the sake of clarity and ease of understanding, the emitter, base and collector connections have been designated as E, B and C respectively. Also, conductivity types of bodies or zones are indicated by the characters N and P. It will be understood that either junction or point contact transistors may be employed in any of the embodiments illustrated.

The amplifier illustrated in Fig. 1 comprises a pair of transistors 10 and 11, the former being of N-type and the latter of P-type. Each transistor has emitter, base and collector connections 12, 13 and 14 respectively. The two devices are connected in series, with the collectors tied together directly, and the emitters connected across terminals 15 of a biasing source 16, the polarity being such that, as is evident from Fig. 1, each of the emitters is biased in the forward direction and each of the collectors is biased in the reverse direction relative to the respective base. An auxiliary biasing source 17, the function of which will appear presently, is connected between the base and emitter of the transistor 10.

Input signals are applied between the base and emitter of the transistor 11 as by way of a coupling transformer 18. The output, in the form of amplified replicas of the input signals, is taken from across the terminals 19.

It will be noted that the collector current of each of the transistors 10 and 11 is furnished by way of a transistor of the opposite type. Hence, each device, in effect, sees the high impedance collector terminal 20 of the other. The high output impedance thus provided leads to high voltage gain and this may be realized through the use of but a relatively low voltage source 16. The source 17 serves merely to bias the transistor 10 in the amplifying range and may be small, say sufficient to provide a bias of the order of 0.5 volt. The source 16 may be of the order of 1.0 volt.

Depending upon the nature of the load, it may be advantageous to operate the transistors at higher or lower current levels. This can be accomplished by applying bias to both transistors. These biases may be supplied by batteries or by self bias.

Figure 2:
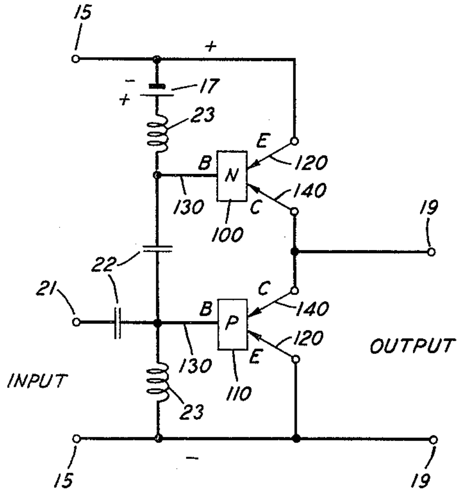
Fig. 2 illustrates an amplifier similar to Fig. 1 but wherein the input is applied to both transistors.

In the embodiment of this invention illustrated in Fig. 2, as in that shown in Fig. 1 and described hereinabove, the P and N transistors 110 and 100 respectively are connected serially across the biasing source terminals 15. However, the input signals are applied to both bases 130 by way of terminal 21 through suitable blocking condensers 22. Choke coils 23 are provided as shown. In effect, it will be noted, from a signal standpoint, the inputs for the two transistors are in parallel and the outputs also are in parallel. Because of the complementary characteristics of the two transistors, referred to hereinabove, the collector current variations for the two will be cumulative in the output circuit connected between terminals 19.

Figure 3:
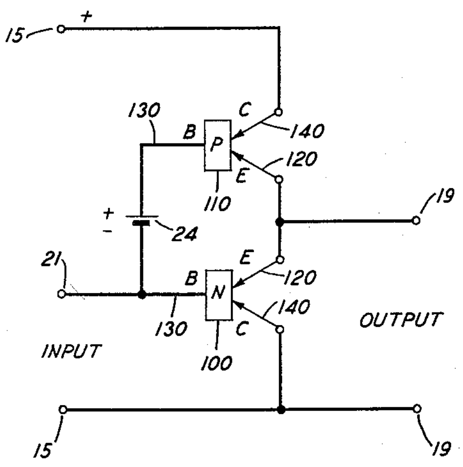
Fig. 3 depicts another embodiment of this invention wherein the two transistors are connected in series with the emitters tied together.

In the embodiment of the invention illustrated in Fig. 3, the P and N transistors 110 and 100 respectively are in series across the biasing source terminals 15 and the two emitters 120 are tied together and to one output terminal 19. The bases 130 also are connected together and to input terminal 21. An auxiliary biasing source 24 may be provided as shown to increase the current through the transistors thereby to decrease the output impedance, the source 24 being poled as shown to provide bias in the forward direction for both of the emitters. Because of the difference in sign of the operating characteristics of the two transistors, input signal variations of both polarities result in substantial variations in the output current. Also, if the output at terminals 19 fails to follow the input at terminals 15 and 21, say due to non-linearity effects, a large output current change of appropriate polarity is produced. Thus, in effect, the circuit disclosed in Fig. 3 acts as a double cathode follower wherein currents of both polarities are carried by the two transistors in combination.

It will be noted that the operation obtainable with circuits in accordance with this invention, such as the circuits shown in the drawing and described hereinabove, is unique and cannot be realized with vacuum tubes. In tube operation, the carriers involved are always of the same sign. In the circuits herein disclosed it will be noted that carriers of opposite sign flow towards the corresponding elements of a pair of N-type and P-type transistors. Consequently, it is possible to connect the two corresponding terminals together without supplying a direct-current path for current to return to the supply. In a sense the common terminal may be regarded as a region where hole current and electron current are combined for the case of a collector and where they are generated for the case of an emitter.

What is claimed is:

1. A signal translating device comprising a pair of transistors of opposite conductivity types, each transistor having base, emitter and collector connections, an output circuit connected between two of said connections of one transistor, an input circuit connected between one of said two connections and the third connection of said one transistor, a connection between one of said two connections and the like connection of the other transistor, and a biasing source connected between the other of said two connections and the like connection of said other transistor.

2. A signal translating device in accordance with claim 1 wherein said transistors are of the junction type.

3. A signal translating device in accordance with claim 1 wherein said transistors are of the point contact type.

4. A signal translating device comprising a pair of transistors of opposite conductivity types and each having a base, an emitter and a collector, the two collectors being connected together, a biasing source connected between the two emitters, an input circuit connected between the base and emitter of one transistor, and an output circuit connected between the emitter and collector of said one transistor.

5. A signal translating device comprising a pair of transistors of opposite conductivity types and each having a base, an emitter and a collector, the two collectors being connected together, a biasing source connected between the two emitters, an output circuit connected between the emitter and collector of one of said transistors, and means for impressing signals upon the bases of both transistors.

6. A signal translating device comprising a pair of transistors of opposite conductivity types and each having a base, an emitter and a collector, the two emitters being connected together, a biasing source connected between the two collectors, an input circuit connected between the base and collector of one transistor, and an output circuit connected between the emitter and collector of said one transistor.

7. A signal translating device comprising a pair of transistors of opposite conductivity types and each having a base, an emitter and a collector, the two emitters being connected together, a biasing source connected between the two collectors, an input circuit connected between the base and collector of one transistor, an output circuit connected between the emitter and collector of said one transistor, and source means connected between the two bases biasing each in the forward direction relative to the respective emitter.

8. A signal translating device comprising a pair of transistors of opposite conductivity types, each transistor having base, emitter and collector terminals, means connecting two like terminals of said transistors directly together, means for impressing signals upon two other like terminals of said transistors, and an output circuit connected between said first two like terminals and the third terminal of one of said transistors.

WILLIAM SHOCKLEY.

References Cited in the file of this patent

UNITED STATES PATENTS

| Number | Name | Date |
| --- | --- | --- |
| 2,524,035 | Bardeen et al. | Oct. 3, 1950 |
| 2,541,322 | Barney | Feb. 13, 1951 |